US006779627B2

(12) United States Patent
Beakes et al.

(10) Patent No.: US 6,779,627 B2
(45) Date of Patent: Aug. 24, 2004

(54) FLAT PANEL SOUND RADIATOR WITH FIRE PROTECTIVE BACK BOX

(75) Inventors: William E. Beakes, Columbia, PA (US); John R. Garrick, Lancaster, PA (US); Kenneth W. Good, Jr., Mt. Joy, PA (US); Jere W. Myers, Washington Boro, PA (US); Kenneth P. Roy, Holtwood, PA (US); Christian Busque, Lititz, PA (US)

(73) Assignee: AWI Licensing Company, Wilmington, DE (US)

( * ) Notice: Subject to any disclaimer, the term of this patent is extended or adjusted under 35 U.S.C. 154(b) by 0 days.

(21) Appl. No.: 10/241,174

(22) Filed: Sep. 11, 2002

(65) Prior Publication Data

US 2004/0045764 A1 Mar. 11, 2004

(51) Int. Cl.[7] .................................................. H05K 5/00
(52) U.S. Cl. ......................... 181/150; 181/30; 181/173; 181/199; 381/152; 381/431
(58) Field of Search ................................ 381/424, 423, 381/431, 398, 152, 71.4, 73.1; 52/506.01, 507, 511, 506.03; 181/148, 150, 157, 199, 30, 189, 198, 206, 145, 164, 166, 171–173

(56) References Cited

U.S. PATENT DOCUMENTS

| | | | | |
|---|---|---|---|---|
| 3,961,378 A | * | 6/1976 | White | 29/594 |
| 4,428,454 A | * | 1/1984 | Capaul et al. | 181/290 |
| 4,506,759 A | * | 3/1985 | Fatovic | 181/151 |
| 5,701,359 A | * | 12/1997 | Guenther et al. | 381/431 |
| 5,755,900 A | * | 5/1998 | Weir et al. | 156/62.2 |
| 5,923,002 A | * | 7/1999 | McGrath et al. | 181/290 |
| 6,015,025 A | * | 1/2000 | McGrath et al. | 181/199 |
| 6,097,829 A | * | 8/2000 | Guenther et al. | 381/425 |
| 6,098,743 A | * | 8/2000 | McGrath | 181/150 |
| 6,164,408 A | * | 12/2000 | Lamm et al. | 181/30 |
| 6,215,881 B1 | * | 4/2001 | Azima et al. | 381/152 |
| 2001/0017930 A1 | * | 8/2001 | Matsudo et al. | 381/412 |

FOREIGN PATENT DOCUMENTS

| | | | | |
|---|---|---|---|---|
| JP | 61050493 A | * | 3/1986 | H04R/7/02 |
| JP | 61050495 A | * | 3/1986 | H04R/7/18 |

* cited by examiner

*Primary Examiner*—David Martin
*Assistant Examiner*—Renata McCloud

(57) ABSTRACT

A fire protective flat panel radiator assembly for installation in a suspended ceiling grid is provided. The assembly includes a flat panel radiator having a frame that supports a sonic diaphragm, which is driven by a transducer to reproduce an audio program. A back box is mounted to the radiator and the back box covers and encloses the diaphragm and other fire susceptible components of the radiator. The back box is provided with a cut-out portion that is covered with an air pervious panel, which is resistant to fire hazards but that allows air flow in and out of the back box. In one embodiment, the radiator has a bridge and the back box is formed by a pair of shells mounted on each side of the bridge to enclose and protect the diaphragm. The result is a fire protected flat panel radiator assembly that meets the fire performance requirements for air handling plenums while retaining the sonic fidelity of a flat panel sound radiator without a fire protective back box.

30 Claims, 3 Drawing Sheets

FLAT PANEL SOUND RADIATOR WITH FIRE PROTECTIVE BACK BOX

TECHNICAL FIELD

This invention relates generally to sound radiators for mounting in a suspended ceiling grid, and more specifically to sound radiators that are fire rated while at the same time retaining the ability to reproduce high fidelity sound.

BACKGROUND

Flat panel sound radiators have improved significantly in their ability to reproduce high fidelity sound for use in background music and paging systems. Such radiators are particularly suited to and have increasingly been employed in commercial sound distribution systems. In such systems, flat panel radiators are mounted within the grid work of suspended ceilings facing downwardly into a space to project sound into the space. The rear or back portion of the radiator is thus located in the plenum space; that is, the space above the plane of the suspended ceiling. In many cases, these flat panel sound radiators are virtually indistinguishable in appearance from standard ceiling tiles that surround the radiators, yet are able to reproduce sound with astonishing fidelity. Since the sound is reproduced primarily through distributed mode reproduction in the panel, it is perceived by those in the space as being uniform and pleasing throughout the space.

One high fidelity flat panel sound radiator is disclosed and claimed in U.S. Pat. No. 6,386,315 of Roy et al., which is assigned to the assignee of the present invention and is hereby incorporated by reference. The sound radiator disclosed in this patent includes a metal frame sized to fit within an opening of a suspended ceiling grid. A radiator panel or diaphragm is mounted within the frame and is supported by resilient foam isolators, which facilitate vibration of the panel to produce sound while isolating the vibration from the surrounding ceiling grid. A rigid metal bridge is mounted at its ends to opposite sides of the metal frame and spans the frame just above the diaphragm. The bridge houses the various electronic components and connectors of the system and may also support one or more magnetic transducers that are operably coupled to the diaphragm. The transducers convert electrical signals corresponding to an audio program into corresponding vibrational motion, which is imparted to the diaphragm for reproducing the audio program. The bridge mounted transducer arrangement has been found to enhance the fidelity of such flat panel radiators because, among other reasons, the weight of the transducer is supported by the bridge, allowing for a more massive magnet structure, and allowing the diaphragm to float freely within the frame. Other similar flat panel radiator designs are disclosed in pending U.S. patent application Ser. No. 10/003,929 entitled Flat Panel Sound Radiator with Supported Exciter and Compliant Surround, and U.S. patent application Ser. No. 10/003,928 entitled Flat Panel Sound Radiator with Enhanced Audio Performance, each of which is owned by the assignee of the present invention and is hereby incorporated by reference.

While flat panel sound radiators for suspended ceiling installation have indeed improved significantly and are becoming more ubiquitous in commercial spaces, they nevertheless have encountered some obstacles. For example, some of the materials typically used in the manufacture of flat panel sound radiators to achieve high fidelity sound, such as craft paper and plastic diaphragms and foam isolators, are not inherently resistant to fire hazards such as heat, smoke, flames, and flaming debris in the event of a fire in the plenum space. This can be a serious problem where building codes require that all products mounted in the plenum space above a suspended ceiling be fire rated. In fact, some flat panel radiators have not been able to pass the Underwriters Laboratory (UL) standard fire test UL 2043, which, in effect, renders them unusable because they cannot be classified as being "fire rated." The term "fire rated" as used herein means conforming to the requirements of specified fire test methods, such as the above mentioned UL 2043 fire test for heat and visible smoke release for discrete products and their accessories installed in air handling spaces.

One possible method of improving the fire performance of a flat panel radiator assembly is to enclose the back of the assembly with a metal box, thereby isolating the diaphragm and other susceptible components from any fire hazard within the plenum space. Unfortunately, this also has the effect of seriously degrading the fidelity of audio material reproduced by the radiator assembly because, among other things, the trapped air within the box acts to dampen vibrations of the diaphragm and because sonic resonances and reflections form in the box, which are then transmitted through the diaphragm into a space below. Another possible solution to the problem might be to manufacture the various components of the system, i.e. the diaphragm and foam isolators, from materials that have improved fire properties. Unfortunately, this might not be a practical solution because materials with good or improved fire properties may not be conducive to the production of high fidelity sound.

Accordingly, a need exists for a high fidelity flat panel sound radiator system for use in suspended ceiling environments that also provides superior fire performance to meet even the most stringent fire tests and building codes. Such a system should produce sound that is virtually indistinguishable in fidelity from sound produced by current high fidelity flat panel radiators while simultaneously protecting susceptible components of the system from fire, heat, smoke, and burning debris. It is to the provision of such a high fidelity flat panel sound radiator system that the present invention is primarily directed, although the concept is equally applicable to any other type of sound radiator such as a traditional cone or piston-type loudspeaker.

SUMMARY OF THE INVENTION

Briefly described, the present invention, in a preferred embodiment thereof, comprises a flat panel sound radiator assembly that meets plenum fire rating codes and yet that reproduces high fidelity sound for background music, paging, and other audio applications. In the preferred embodiment, the radiator comprises a rectangular metal frame that supports a diaphragm designed to reproduce audio material. The diaphragm is supported in the frame by a compliant isolator, which may take the form of a foam surround. The compliant isolator enhances the fidelity of sound reproduced by the diaphragm and isolates the diaphragm from the frame and the surrounding ceiling grid structures. An elongated bridge is attached at its ends to opposite legs of the metal frame and spans the flat panel radiator just above the back surface of the diaphragm. The bridge supports various electronic components of the radiator such as a volume control, a transformer, and connecting wires. The bridge may also support one or more magnetic transducers that are operatively coupled to the diaphragm for imparting to the diaphragm vibrations corresponding to an audio program to be reproduced.

A back box assembly is mounted to the frame and to the bridge and is configured to enclose the entire back of the sound radiator. In the preferred embodiment, the back box is formed from a pair of generally rectangular shells, each of which is attached to the radiator on a corresponding side of the bridge. The back box thus encloses and isolates the diaphragm, foam surround, and other fire susceptible components of the radiator assembly from the surrounding environment within a plenum space. In the event of a fire in the plenum, these elements are protected by the back box assembly from heat, flame, smoke, and flaming debris and, accordingly, the flat panel radiator of this invention is fire rated and easily meets or exceeds plenum fire protective codes and passes the standard UL 2043 fire protection test.

In order to provide such fire performance without adversely affecting the fidelity of sound reproduced by the diaphragm of the radiator, the upper panels of the back box shells are partially cut out and one or more panels of a porous material such as a non-woven fiberglass or other appropriate material is mounted in the cut-out. The porous material provides adequate protection from heat and flames, but, because of its porous nature, air is permitted to flow relatively freely through the material. As a result, the diaphragm is free to vibrate when reproducing an audio program without being damped by a compliant volume of air trapped behind the diaphragm as would be the case in a closed back box. Sound degrading resonances and reflections also are eliminated. Accordingly, the flat panel radiator of this invention reproduces an audio program with fidelity that is equal to or just slightly, but acceptably, degraded from a sound radiator with no fire rated back box at all.

This invention thus provides a fire rated flat panel sound radiator for installation in a suspended ceiling that retains the high fidelity sound reproduction characteristics of flat panel radiators such as those disclosed in the incorporated references. Radiators constructed according to the invention easily pass UL fire tests and can be installed in commercial buildings with stringent plenum fire rating requirements. This invention is equally applicable to any loudspeaker such as a traditional cone or piston device when similarly applied within a suspended ceiling system.

These and other features, objects, and advantages of the invention will become more apparent upon review of the detailed description set forth below taken in conjunction with the accompanying drawing figures, which are briefly described as follows.

DETAILED DESCRIPTION OF THE PREFERRED EMBODIMENTS

Figure 1:
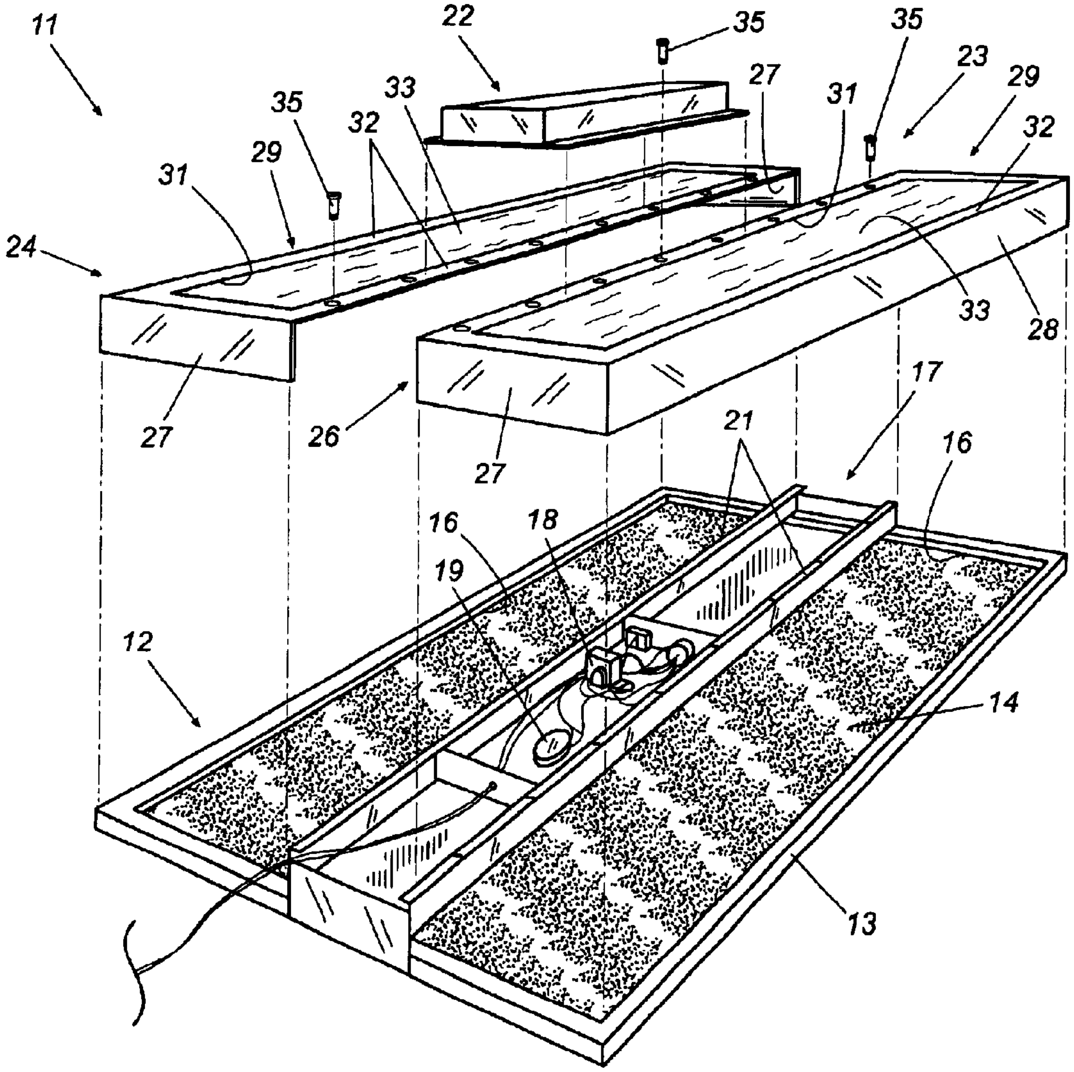
FIG. 1 is an exploded perspective view of a fire protective high fidelity flat panel sound radiator that embodies principles of the present invention in a preferred form.

Referring now in more detail to the drawing figures, wherein like reference numerals refer to like parts throughout the several views, FIG. 1 illustrates a preferred embodiment of the present invention and represents a best mode known to the inventors of carrying out the invention. In the discussion that follows, the invention is described in the context of the preferred embodiment, i.e. a flat panel radiator. It will be understood by those of skill in the art, however, that the invention is equally applicable to other types of plenum mounted loudspeakers such as traditional cone-type speakers, and indeed to any plenum mountable structure that needs to be fire rated.

In the figures, a flat panel sound radiator assembly 11 comprises a flat panel radiator 12 formed with a rectangular metal frame 13 that supports a sonic diaphragm 14. In the illustrated embodiment, the legs of the frame 13 are generally C-shaped in cross section and the diaphragm 14 is mounted in the frame by means of a compliant foam surround 16. The foam surround allows movement of the diaphragm and isolates the diaphragm from the frame and the surrounding ceiling grid structures. It will be understood that the frame, diaphragm, and diaphragm mounting structure may take on any of a variety of configurations other than that illustrated in the figures, some of which are disclosed in the incorporated references, all within the scope of the present invention. The details of the components of the radiator assembly are discussed in some detail in the incorporated references and need not be described in great detail here. Generally, however, the diaphragm preferably is formed with a honeycomb core covered by front and back skins and the materials of the core and skins are selected to provide the diaphragm with high fidelity sound reproduction characteristics. The surround may be a continuous or discontinuous compliant foam or rubberized material to constrain the diaphragm perimeter and provide vibration isolation from the frame.

A metal bridge 17 is mounted at its ends to opposite legs of the frame 13 and the bridge spans the radiator just above the back surface of the diaphragm 14. The bridge is configured with an electronics compartment that houses electronic components 18 of the system, which may include sophisticated on-board audio components and/or appropriate volume controls, switches, transformers, and associated wiring, as detailed in the incorporated references. The bridge also may support the magnet structure of a transducer 19. One such transducer is shown in the illustrated embodiment, but it will be understood that the bridge may support more than one transducer depending upon the design of the radiator. The transducer is operatively coupled through a voice coil assembly (not shown) to the diaphragm to impart vibratory motion to the diaphragm when the transducer is supplied with electrical signals corresponding to an audio program to be reproduced. With this configuration, the bridge supports most of the weight of the transducer assembly, which allows larger magnets and voice coil assemblies to be employed to enhance the sonic fidelity of the flat panel sound radiator. An electronics compartment cover 22 is configured to cover and provide fire protection for the electronic components within the electronic compartment of the bridge 17.

A fire protective back box assembly 23 is configured to be mounted to the flat panel radiator and, once mounted, to cover and enclose the back of the radiator, including the diaphragm and foam surround, which can be susceptible to fire. In the illustrated embodiment, the back box assembly 23 is formed from an appropriate material such as aluminum and comprises a first generally rectangular shell 24 for covering the portion of the radiator on one side of the bridge 17 and a second generally rectangular shell 26 for covering the portion of the radiator on the other side of the bridge 17. It should be appreciated that the configuration of the back box assembly may be different than that illustrated in the drawings depending upon the configuration of the flat panel radiator to which it is to be attached. In this regard, it is the covering and protecting of the components susceptible to fire that is important and not necessarily the particular configuration of the back box that accomplishes this goal.

The first and second shells 24 and 26 each is formed with end panels 27, a side panel 28, and a top panel 29. The top panel 29 of each shell is provided with a central cut-out portion 31. In the illustrated embodiment, the cut-out portions 31 are rectangular in shape and each is surrounded by a relatively thin cartouche or frame 32. It should be understood, however, that cut-out portions with other configurations such as, for instance, round or oval cut-outs, also may be provided within the scope of the invention. A porous panel 33 is mounted in and spans each cut-out portion 31. In the preferred embodiment, each porous panel is mounted with adhesive to the underside of the top panel and is supported by the surrounding frame 32, although the porous panel may be mounted in a variety of other ways if desired. The porous panel 33 preferably is made of a material that is resistant to heat, flame, and flaming debris in the event of a plenum fire but that also is air pervious to allow relatively free air flow into and out of the back box when attached to the flat panel radiator. In this regard, it has been found that one or more layers of a non-woven fiberglass sheet material available from the Owens Corning corporation functions admirably as a porous material. However, other porous materials may be chosen and any such material that exhibits the requisite fire protective and air flow characteristics is contemplated within the invention.

Figure 2:
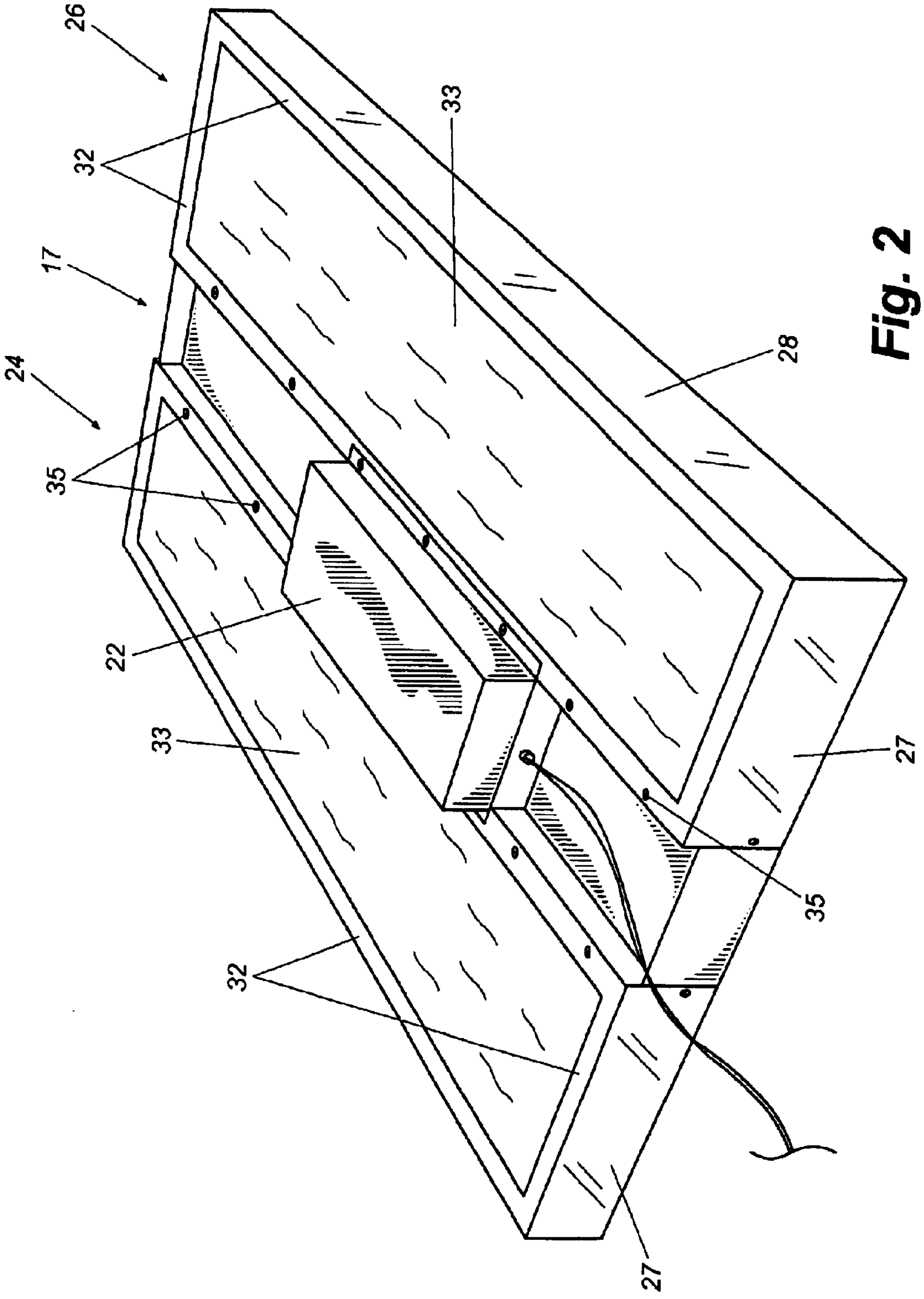
FIG. 2 is a perspective view of the flat panel sound radiator of FIG. 1 showing the various components assembled together.

FIG. 2 illustrates the fire protective flat panel radiator of this invention as it appears when assembled. The first shell 24 is mounted to the flat panel radiator covering and enclosing the portion of the panel on one side of the bridge 17 and the second shell 26 is mounted to the radiator covering and enclosing the portion of the panel on the other side of the bridge 17. The bridge itself covers the central portion of the diaphragm, surround, and other components beneath the bridge. The electronics cover 22 is mounted atop and covers the electronic components in the electronics compartment of the bridge. The shells and electronics cover may be secured to the flat panel radiator in any appropriate manner such as, for instance, with pop rivets or screws 35 secured through these components to the flanges 21 (FIG. 1) of the bridge. Any method of securing the back box assembly to the flat panel radiator should be considered to be encompassed by the invention.

With the back box assembly and electronics cover attached as illustrated in FIG. 2, the entire back surface of the flat panel radiator, which faces and is disposed in the plenum when the radiator is installed in a suspended ceiling grid, is covered and enclosed within the back box and bridge combination. Fire susceptible components such as the diaphragm and foam surround are therefore completely isolated and protected from the surrounding environment within the plenum space. In the event of a plenum fire, these components are protected from heat, flame, smoke, and flaming debris such that the flat panel radiator assembly meets or exceeds plenum fire rating requirements. Further, the assembly of this invention has been subjected to the standard UL 2043 fire test for plenum mounted structures and has passed the test easily. In addition, since the porous material allows relatively free flow of air in and out of the enclosed space above the back surface of the diaphragm, vibrational movement of the diaphragm is not significantly damped or otherwise affected by a volume of trapped air, and sonic resonances do not form within the back box. As a result, the flat panel radiator of this invention, in addition to being fire rated, reproduces audio with a fidelity that is substantially the same or only slightly degraded from that of a flat panel radiator with no back box at all.

Figure 3:
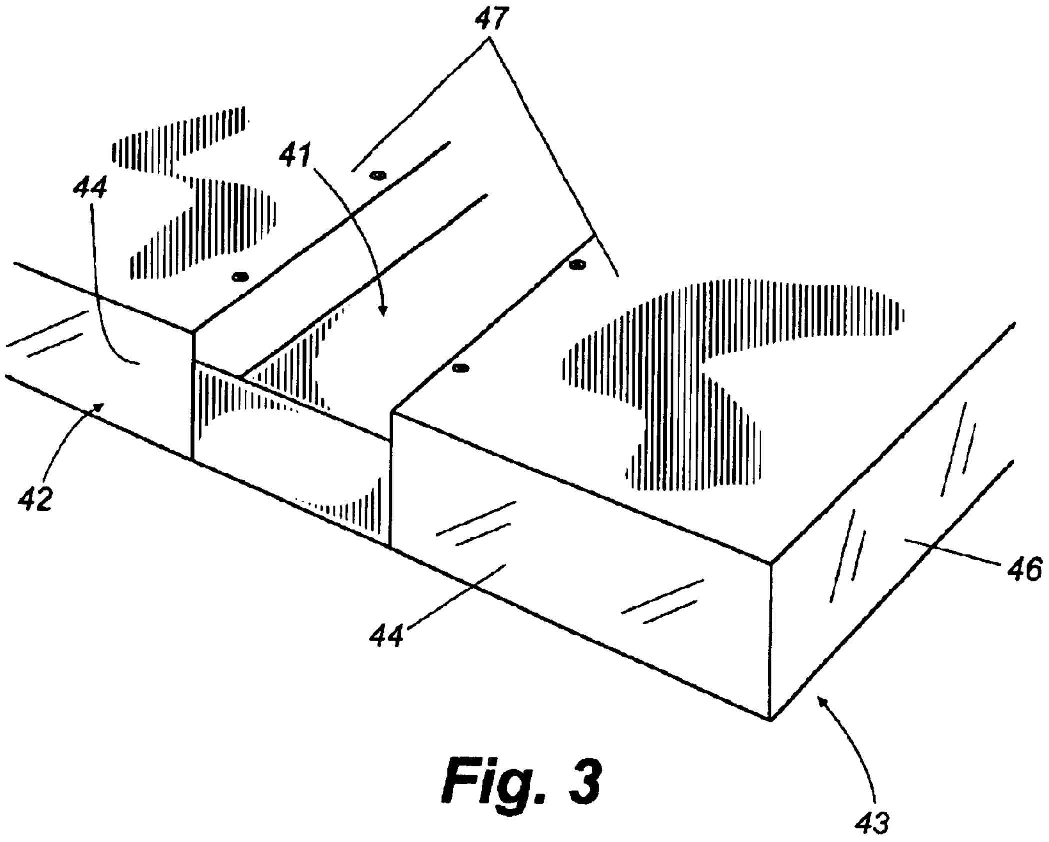
FIG. 3 is a perspective view of a portion of an alternate embodiment of the invention that does not exhibit the porous panels of FIGS. 1 and 2.

FIG. 3 illustrates another embodiment of the invention for use with flat panel radiators where fidelity of reproduced sound is not as critical. In this embodiment, shells 42 and 43 are mounted on either side of a bridge 41 covering the diaphragm and other components beneath, as described above. Each shell has end panels 44, a side panel 46, and a top panel 47. In this embodiment, however, the top panel is not provided with a cut-out section and porous panels, but instead is a solid metal panel. While this embodiment provides more than adequate protection from fire, it does result in a noticeable degradation of the fidelity of sounds reproduced by the panel. However, in some applications, such as for pure paging, masking noise generation, and the like, sonic fidelity is not as critical as in other applications where, for instance, high fidelity background music is to be produced. In these instances, the solid back box configuration of FIG. 3 has proven to be more than adequate for providing a fire protective flat panel radiator for suspended ceiling installation.

EXAMPLE

In order to verify the effectiveness of the present invention in providing protection from fire, prototypes similar to the embodiment shown in FIGS. 1 and 2 were subjected to the UL 2043 fire test for plenum mounted structures, with the following results. It can be seen from these test results that the prototypes failed at least one of the test requirements with no back box, but passed all requirements handily when provided with a back box according to the invention.

| TEST REQUIRED TO PASS | MAX HEAT 100 | MAX SMOKE 0.50 | AVERAGE SMOKE 0.15 |
|---|---|---|---|
| Prototype 1 with no back box | 21 (passed) | 0.70 (failed) | 0.03 (passed) |
| Prototype 1 with back box | 0 (passed) | 0.10 (passed) | 0.00 (passed) |
| Prototype 2 with no back box | 46 (passed) | 1.29 (failed) | 0.09 (passed) |
| Prototype 2 with back box | 3 (passed) | 0.22 (passed) | 0.03 (passed) |

In addition, a panel of audio experts listened critically to the prototypes in various configurations to determine the effect of the back box on the sonic fidelity of the radiators. In each case, air flow through the porous panel was measured in cuft/sqft/min (known as Frasier air flow) to correlate sonic performance with the air flow characteristics of the porous panel material. The results of this test are as follows.

| PROTOTYPE CONFIGURATION | FRASIER AIR FLOW (cuft/sqft/min) | SONIC PERFORMANCE |
|---|---|---|
| Prototype 1 with all metal back box-no porous panel | 0 | Very noticeably degraded from radiator with no back box |

-continued

| PROTOTYPE CONFIGURATION | FRASIER AIR FLOW (cuft/sqft/min) | SONIC PERFORMANCE |
|---|---|---|
| Prototype 1 with one layer of porous material | 399 | Not noticeably degraded from radiator with no back box |
| Prototype 1 with two layers of porous material | 245 | Very slightly noticeable degradation from radiator with no back box |
| Prototype 1 with painted porous material | 46 | Noticeably but acceptably degraded from radiator with no back box |
| Prototype 2 with all metal back box-no porous panel | 0 | Totally unacceptable sonic performance |
| Prototype 2 with one layer of porous material | 399 | Not noticeably degraded from radiator with no back box |
| Prototype 2 with two layers of porous material | 245 | Very slightly degraded from radiator with no back box |
| Prototype 2 with painted porous panel | 46 | Noticeably but acceptably degraded from radiator with no back box |

It can therefore be seen from the forgoing tests that the present invention indeed lives up to its billing by providing improved fire performance to high fidelity flat panel sound radiators mountable in suspended ceiling grids while at the same time preserving the demonstrated high fidelity sound reproduction characteristics of radiators with no back box fire protection at all.

The invention has been described herein in terms of preferred embodiments and methodologies considered by the inventors to be the best mode of carrying out the invention. It will be understood by those of skill in the art, however, that various additions, deletions, and modifications to the particular embodiments disclosed herein may be implemented without departing from the spirit and scope of the invention as set forth in the claims. For example, this invention is equally applicable to any loudspeaker such as a cone or piston-type speakers when similarly applied within a suspended ceiling system. Indeed, as mentioned above, it is applicable to any plenum mountable products that are required to be fire rated.

What is claimed is:

1. A fire protected sound radiator assembly comprising:

a sound radiator having a frame supporting a diaphragm;

a transducer operatively coupled to the diaphragm for imparting to the diaphragm vibratory motion corresponding to an audio program to be reproduced by the diaphragm;

a fire protective back box having an opening formed therein and being mounted to said the radiator, the back box covering and substantially enclosing the diaphragm; and an air pervious panel mounted in and spanning the opening formed in the back box.

2. The fire protected sound radiator assembly of claim 1, wherein the air pervious panel exhibits a Frasier air flow in a range from about 0 to about 399 cubic feet per square foot per minute.

3. The fire protected sound radiator assembly of claim 1, wherein the air pervious panel is formed of a fire resistant sheet material.

4. The fire protected sound radiator assembly of claim 3, wherein the air pervious panel is made of a fire resistant fiberglass sheet material.

5. The fire protected sound radiator assembly of claim 4, wherein the air pervious panel is made of a non-woven fiberglass sheet material.

6. The fire protected sound radiator assembly of claim 3, wherein the air pervious panel is made of a woven or non-woven sheet material.

7. The fire protected sound radiator assembly of claim 6, wherein the woven or non-woven sheet material is a woven or non-woven fiberglass sheet material.

8. The fire protected sound radiator assembly of claim 1, wherein the sound radiator is a flat panel sound radiator.

9. The fire protected sound radiator assembly of claim 8, wherein the flat panel radiator includes a bridge and the back box comprises a first shell mounted on one side of the bridge, the first shell covering a first portion said the diaphragm and a second shell mounted on the other side of said the bridge, the second shell covering a second portion of said the diaphragm.

10. A fire protected flat panel radiator assembly comprising:

a flat panel radiator having a frame supporting a diaphragm;

a transducer operatively coupled to the diaphragm for imparting to the diaphragm vibratory motion corresponding to an audio program to be reproduced by the diaphragm; and a fire protective back box mounted to the radiator, the back box covering and substantially enclosing the diaphragm, wherein the flat panel radiator includes a bridge and the back box comprises a first shell mounted on one side of the bridge, the first shell covering a first portion the diaphragm and a second shell mounted on the other side of the bridge, the second shell covering a second portion of the diaphragm, and wherein at least one of the first and second shells is formed with a cut-out portion and a porous panel of sheet material mounted in the cut-out portion.

11. The fire protected flat panel radiator assembly of claim 10, wherein the porous panel is made of a material that exhibits a Frasier air flow between about 0 and about 399 cubic feet per square foot per minute.

12. The fire protected flat panel radiator assembly of claim 11, wherein the porous panel is made of a non-woven sheet material.

13. The fire protected flat panel radiator assembly of claim 12, wherein said the porous panel is made of a fiberglass material.

14. The fire protected flat panel radiator assembly of claim 10, wherein each of said the first and second shells is formed with a cut-out portion and a porous panel of sheet material is mounted in each cut-out portion.

15. The fire protected flat panel radiator assembly of claim 14, wherein the cut-out portions are substantially rectangular.

16. A fire protected sound radiator assembly comprising:

a flat panel radiator having a frame supporting a diaphragm;

a bridge spanning and overlying the diaphragm, the bridge supporting electronic components;

a transducer operatively coupled to the diaphragm;

a first shell mounted to the radiator on one side of the bridge covering and substantially enclosing a first portion of the diaphragm;

a second shell mounted to the radiator on the other side of the bridge covering and substantially enclosing a second portion of the diaphragm, the bridge and the first and second shells together form a back box that encloses and protects at least the diaphragm from fire;

a cut-out portion in each of the first and second shells; and an air pervious panel mounted in and spanning each cut-out portion to permit the flow or of air in and out of said the back box.

17. The tire protected sound radiator assembly of claim 16, wherein each of said the air pervious panels is made of a sheet material having a Frasier air flow between about 0 and about 399 cubic feet per square foot per minute.

18. The fire protected sound radiator assembly of claim 17, wherein each of said the air pervious panels is made from a fiberglass material.

19. The fire protected sound radiator assembly of claim 18, wherein the fiberglass material is a non-woven fiberglass material.

20. A method of protecting fire susceptible components of a flat panel sound radiator from fire hazards, while preserving the sonic fidelity of the flat panel sound radiator, said method comprising the steps of covering and enclosing the fire susceptible components of the flat panel sound radiator with a fire resistant back box having a cut-out, and mounting an air-pervious panel made of fire resistant sheet material within the cut-out.

21. The method of claim 20, wherein the sheet material is a fiberglass sheet material.

22. The method of claim 21 and wherein the fiberglass sheet material is a non-woven fiberglass sheet material.

23. A fire protective back box for mounting to the back of a sound radiator assembly to protect components of the sound radiator assembly from fire hazards, the back box comprising:

a body configured to be received on the back of the sound radiator assembly substantially covering and enclosing the components of the sound radiator susceptible to fire;

an opening formed in said body to permit the flow of air into and out of said the back box; and an air pervious panel mounted in and substantially spanning said the opening.

24. The fire protective back box of claim 23, wherein the air pervious panel exhibits a Frasier air flow in a range from about 0 and to about 399 cubic feet per square foot per minute.

25. The fire protective back box of claim 23, wherein the air pervious panel is formed of a fire resistant sheet material.

26. The fire protective back box of claim 25, wherein said the fire resistant sheet material comprises a fiberglass sheet material.

27. The fire protective back box of claim 26, wherein the fiberglass sheet material is a non-woven fiberglass sheet material.

28. The fire protective back box of claim 23, wherein the body is configured to form a rectangular shell for mounting to a rectangular flat panel sound radiator.

29. The fire protective back box of claim 28, wherein the rectangular shell is formed of a first shell portion that covers a first portion of a flat panel sound radiator, and a second portion separate from the first portion that covers a second portion of a flat panel sound radiator.

30. The fire protective back box of claim 29, wherein the shell portions are configured to be mounted to a flat panel sound radiator with a bridge disposed between said shell portions.

* * * * *

UNITED STATES PATENT AND TRADEMARK OFFICE

CERTIFICATE OF CORRECTION

PATENT NO. : 6,779,627 B2
APPLICATION NO. : 10/241174
DATED : August 24, 2004
INVENTOR(S) : Beakes et al.

It is certified that error appears in the above-identified patent and that said Letters Patent is hereby corrected as shown below:

Column 7
Claim 1, 8th line, Remove the word “said”

Column 8
Claim 9, 4th line, Remove the word “said”
Claim 9, 6th line, Remove the word “said”
Claim 9, 7th line, Remove the word “said”
Claim 13, 2nd line, Remove the word “said”
Claim 14, 2nd line, Remove the word “said”

Column 9
Claim 16, 17th line, Remove the word “or”
Claim 16, 18th line, Remove the word “said”
Claim 17, 1st line, Replace the word “tire” with --fire--
Claim 17, 2nd line, Remove the word “said”
Claim 18, 2nd line, Remove the word “said”
Claim 20, 6th line, Insert --formed therein;-- after the word “cut-out,”

Column 10
Claim 23, 10th line, Remove the word “said”
Claim 23, 12th line, Remove the word “said”
Claim 26, 1st line, Remove the word “said”
Claim 30, 3rd line, Replace the word “said” with --the--

Signed and Sealed this

Twentieth Day of May, 2008

JON W. DUDAS
*Director of the United States Patent and Trademark Office*

UNITED STATES PATENT AND TRADEMARK OFFICE

CERTIFICATE OF CORRECTION

PATENT NO. : 6,779,627 B2
APPLICATION NO. : 10/241174
DATED : August 24, 2004
INVENTOR(S) : Beakes et al.

It is certified that error appears in the above-identified patent and that said Letters Patent is hereby corrected as shown below:

Column 7
Claim 1, line 59, Remove the word "said"

Column 8
Claim 9, line 21, Remove the word "said"
Claim 9, line 23, Remove the word "said"
Claim 9, line 24, Remove the word "said"
Claim 13, line 54, Remove the word "said"
Claim 14, line 57, Remove the word "said"

Column 9
Claim 16, line 12, Remove the word "or"
Claim 16, line 13, Remove the word "said"
Claim 17, line 14, Replace the word "tire" with --fire--
Claim 17, line 15, Remove the word "said"
Claim 18, line 19, Remove the word "said"
Claim 20, line 28, Insert --formed therein;-- after the word "cut-out,"

Column 10
Claim 23, line 6, Remove the word "said"
Claim 23, line 8, Remove the word "said"
Claim 26, line 17, Remove the word "said"
Claim 30, line 35, Replace the word "said" with --the--

This certificate supersedes the Certificate of Correction issued May 20, 2008.

Signed and Sealed this

Seventeenth Day of June, 2008

Jon W. Dudas

JON W. DUDAS
*Director of the United States Patent and Trademark Office*